(12) United States Patent
Loeppert et al.

(10) Patent No.: US 11,753,295 B2
(45) Date of Patent: Sep. 12, 2023

(54) MEMS DEVICE WITH ELECTRODES AND A DIELECTRIC

(71) Applicant: Knowles Electronics, LLC, Itasca, IL (US)

(72) Inventors: Peter V. Loeppert, Durand, IL (US); Michael Pedersen, Long Grove, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 18/079,519

(22) Filed: Dec. 12, 2022

(65) Prior Publication Data

US 2023/0166966 A1 Jun. 1, 2023

Related U.S. Application Data

(63) Continuation of application No. 17/111,465, filed on Dec. 3, 2020, now Pat. No. 11,554,953.

(51) Int. Cl.
*B81B 7/04* (2006.01)
*B81C 1/00* (2006.01)
*B81B 3/00* (2006.01)

(52) U.S. Cl.
CPC ........ *B81C 1/00166* (2013.01); *B81B 3/0021* (2013.01); *B81B 2203/04* (2013.01); *B81C 2201/01* (2013.01)

(58) Field of Classification Search
CPC ............ B81C 1/00166; B81C 2201/01; B81B 3/0021; B81B 2203/04
See application file for complete search history.

(56) References Cited

U.S. PATENT DOCUMENTS 11,554,951 B2 * 1/2023 Loeppert .............. H04R 19/005

* cited by examiner

*Primary Examiner* — Samuel A Gebremariam
(74) *Attorney, Agent, or Firm* — Loppnow & Chapa; Matthew C. Loppnow (57) ABSTRACT

A MEMS device can include a solid dielectric including a plurality of apertures, the solid dielectric having a first side and a second side. The MEMS device can include a first plurality of electrodes extending completely through a first subset of the plurality of apertures, a second plurality of electrodes extending partially through a second subset of the plurality of apertures, a third plurality of electrodes extending partially into a third subset of the plurality of apertures. The MEMS device can include a first diaphragm coupled to the first plurality and to the third plurality of electrodes, the first diaphragm facing the first side of the solid dielectric. The MEMS device can include a second diaphragm coupled to the first plurality and to the second plurality of electrodes the second diaphragm facing the second side of the solid dielectric.

12 Claims, 12 Drawing Sheets

MEMS DEVICE WITH ELECTRODES AND A DIELECTRIC

BACKGROUND

1. Field

The present disclosure is directed to a microelectromechanical systems (MEMS) device with electrodes and a dielectric.

2. Introduction

Presently, consumer electronic devices like mobile phones, personal computers, smart speakers, hearing aids, and True Wireless Stereo (TWS) earphones among other host devices commonly incorporate one or more small microphones, sensors, and/or actuators. Advancements in micro and nanofabrication technologies have led to the development of MEMS devices, such as microphones, sensors, and actuators, having progressively smaller size and different form-factors. Increasing the bias voltage of capacitive microphones, sensors, actuators, and other capacitive elements in MEMS devices leads to higher output and other operation, but also increases the tendency towards collapse and increases the mechanical stiffness of the system.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore considered to limit its scope. The drawings may have been simplified for clarity and are not necessarily drawn to scale.

DETAILED DESCRIPTION

Embodiments can provide a MEMS device with electrodes and a dielectric. According to a possible embodiment, a MEMS device can include a first electrode oriented lengthwise along and parallel to an axis. The first electrode can have a first end and a second end. The MEMS device can include a second electrode oriented lengthwise along and parallel to the axis. The second electrode can have a first end and a second end. The MEMS device can include a third electrode oriented lengthwise along and parallel to the axis. The third electrode can have a first end and a second end. The MEMS device can include a solid dielectric including a plurality of apertures. The first, second, and third electrodes can each be located at least partially within an aperture of the plurality of apertures. The dielectric can surround the second end of the second electrode and the first end of the third electrode. The first end of the second electrode and the second end of the third electrode can be located outside of the solid dielectric.

At least some embodiments can be based on a dielectric actuator where a dielectric is placed between electrodes at different potentials. The resulting electrostatic force operates to pull the dielectric and electrodes so that the dielectric covers as much of the electrodes as possible thereby maximizing the capacitance between them. The force is proportional to the change in capacitance with displacement and with the square of the voltage.

To elaborate, when a voltage is applied between adjacent electrodes, there is an electrostatic force created to pull the dielectric and electrodes in a manner that more fully engages the dielectric and electrodes. The energy in a capacitor is $E=\frac{1}{2} CV^2$. Moving the dielectric into a gap between the electrodes increases the capacitance. The electrostatic force $F=\delta E/\delta z=\frac{1}{2}\, \delta C/\delta z\, V^2$, where z is the direction of the engagement of the dielectric and the electrodes. The capacitance between electrodes varies linearly as a function of dielectric displacement as long as the dielectric ends do not get too close to the ends of the conductive electrode and as long as the electrodes are ideally shaped. Thus, the electrostatic force produced is constant regardless of the position of the dielectric between the electrodes.

In traditional parallel plate sensors, the electrostatic force varies inversely with the square of the gap between plates. In a MEMS device, such as a microphone, the electrostatic force causes the diaphragm to deflect and thus stiffen as a function of displacement. When a dielectric motor is used as a sensor in a MEMS device, such as a microphone, the electrostatic force produced by the motor can cause the diaphragm to bow and thus contributes to the stiffness of a diaphragm. This additional stiffness is proportional to the square of the applied voltage. The sensitivity of the sensor is also proportional to the applied voltage so there is a conflict between increasing the applied voltage to increase sensitivity and the decreasing mechanical compliance, i.e. increasing stiffness, of the diaphragm. At least some embodiments can provide a dual dielectric motor which can make overall compliance independent of applied voltage, at least to the first order.

One problem in conventional parallel plate MEMS microphones is the tendency for the diaphragm to collapse onto the back plate under high shock or acoustic loads. A dual diaphragm, single back plate microphone can become highly unstable as the diaphragm to back plate gap becomes unequal. Using a dual dielectric motor for sensing can avoid both the electrostatic collapse and the electrostatic stiffening of the diaphragm(s). Some embodiments can use two opposed dielectric motors to balance the electrostatic force between them. In some embodiments, this can allow for large bias voltages with little or no net electrostatic force nor gradient of electrostatic force with position applied between electrodes and the dielectric of a MEMS device.

Figure 1:
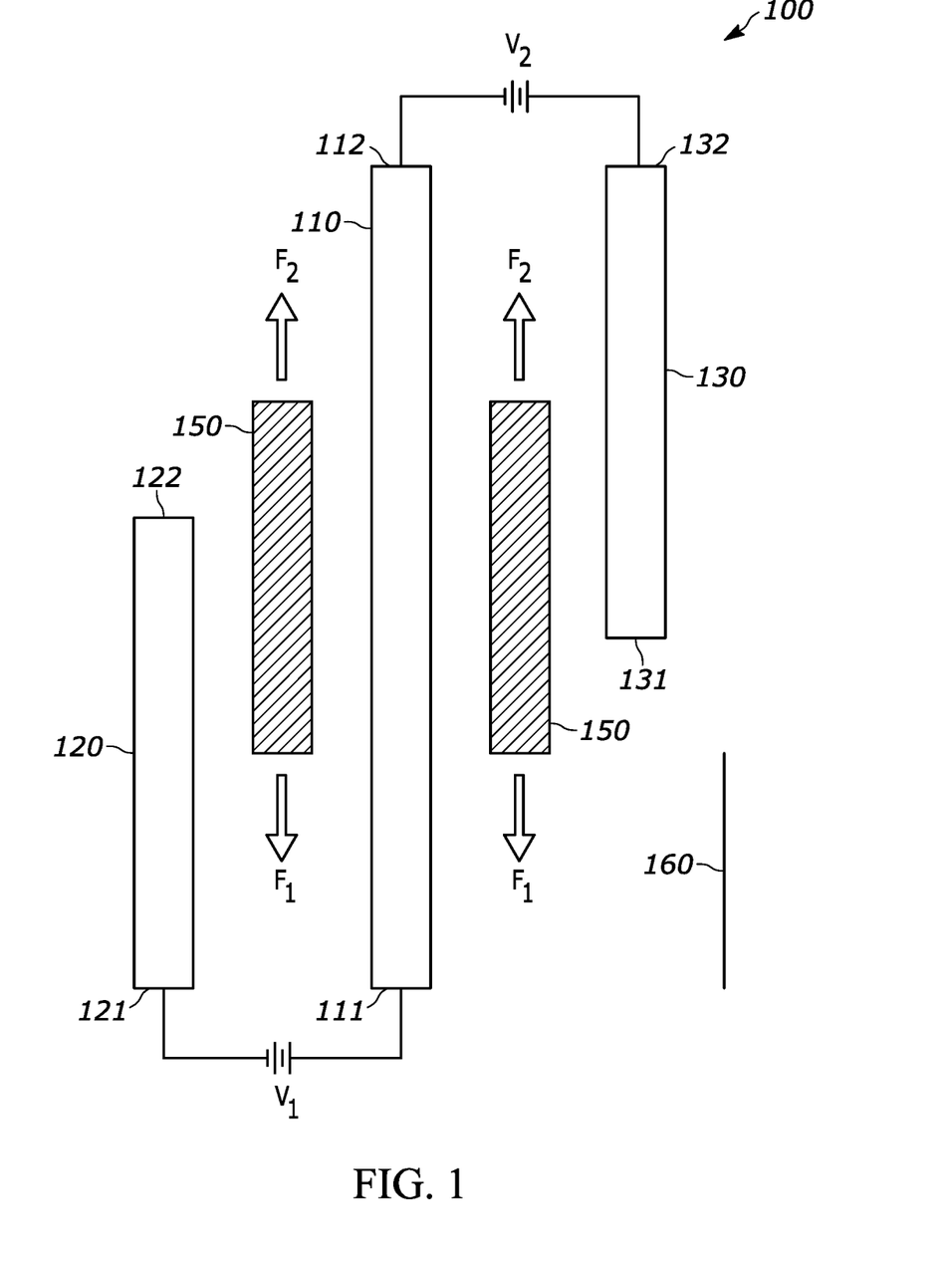
FIG. 1 is an example cross-section view of a MEMS device according to a possible embodiment.
Figure 2:
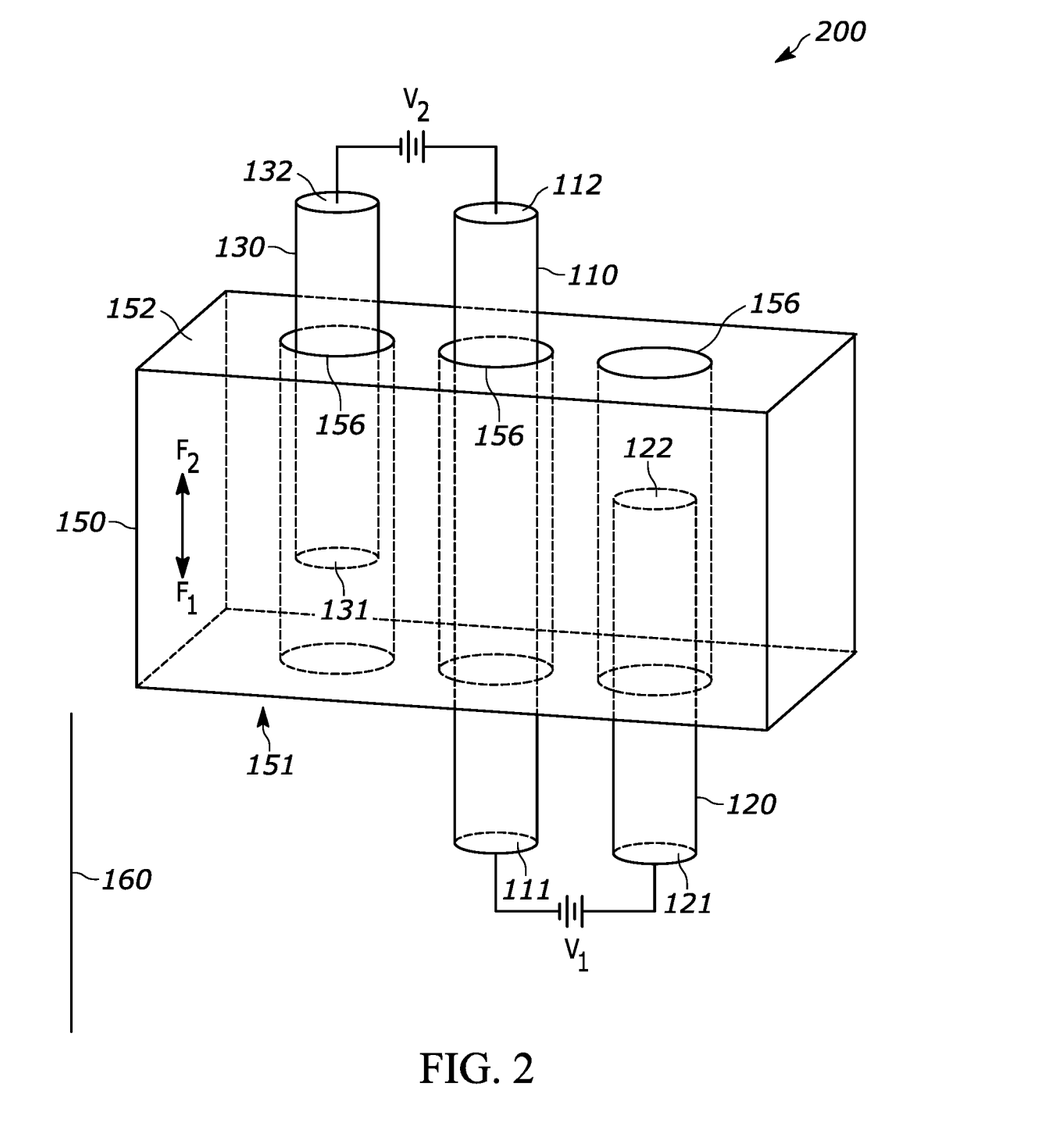
FIG. 2 is an example isometric view of a MEMS device according to a possible embodiment.
Figure 3:
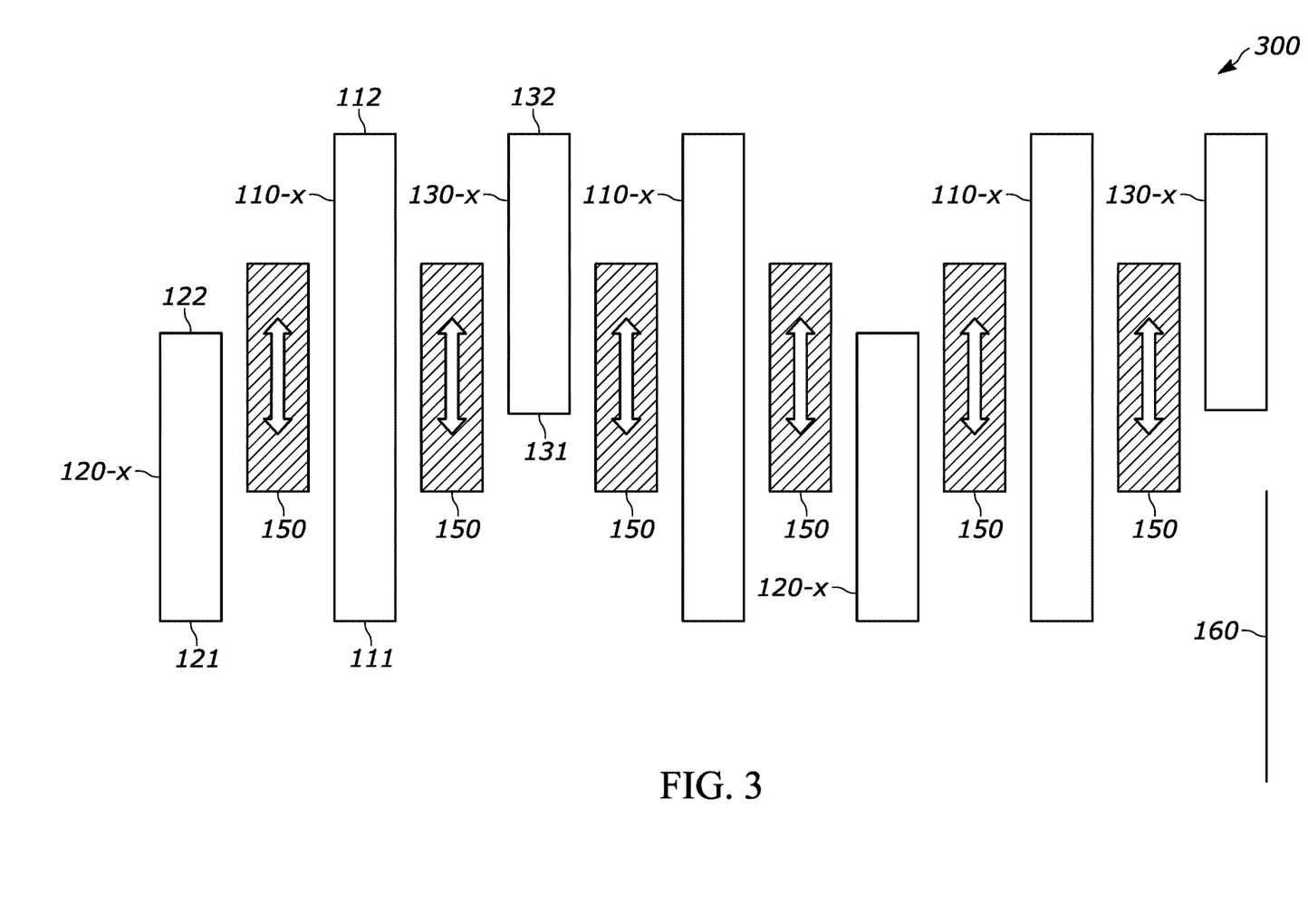
FIG. 3 is an example cross-section view of a MEMS device according to a possible embodiment.
Figure 10:
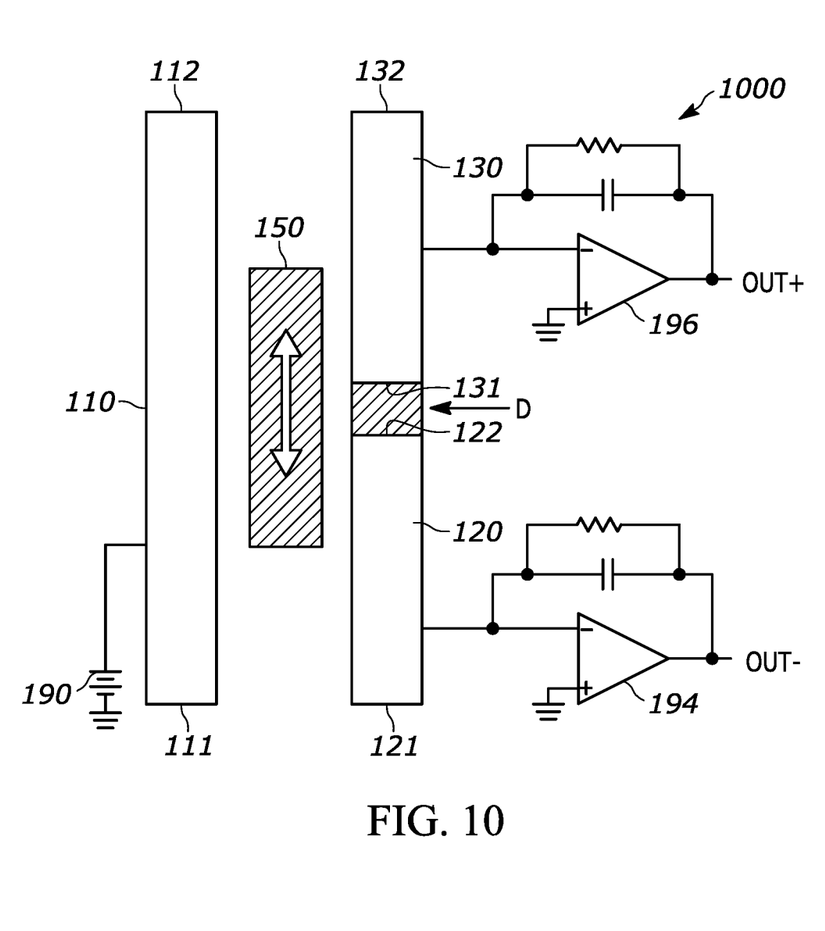
Figure 11:
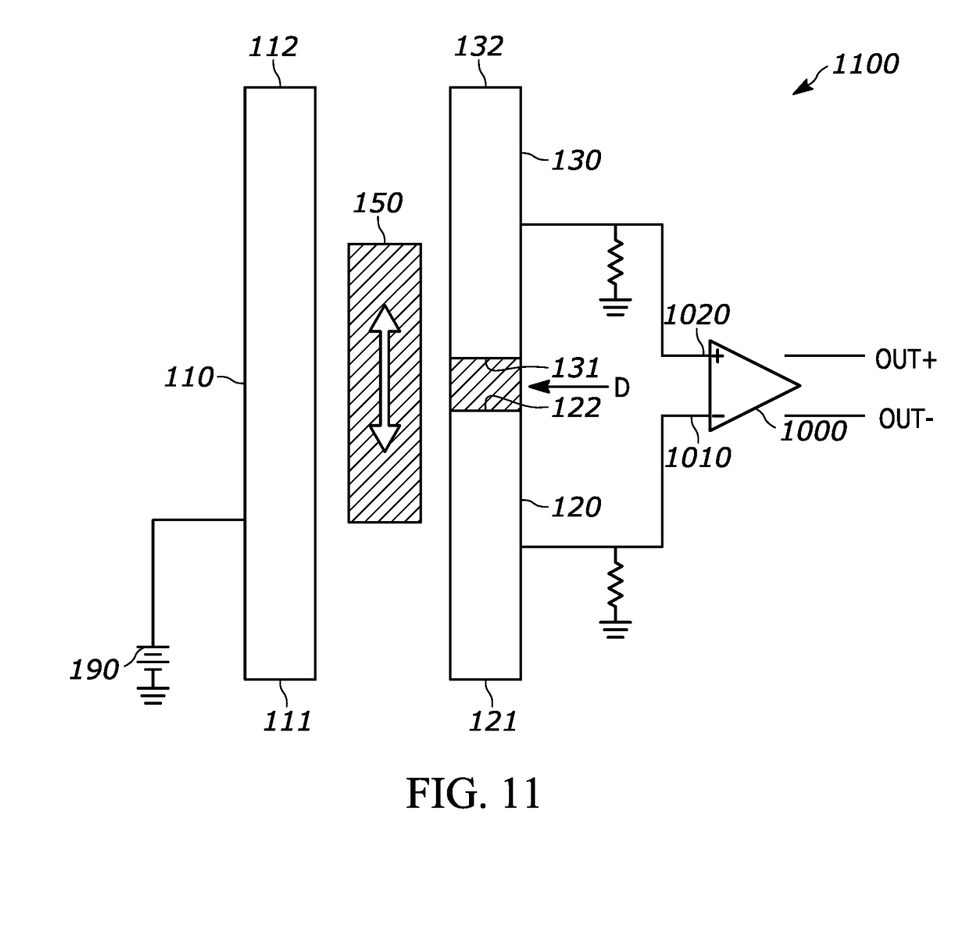
Figure 12:
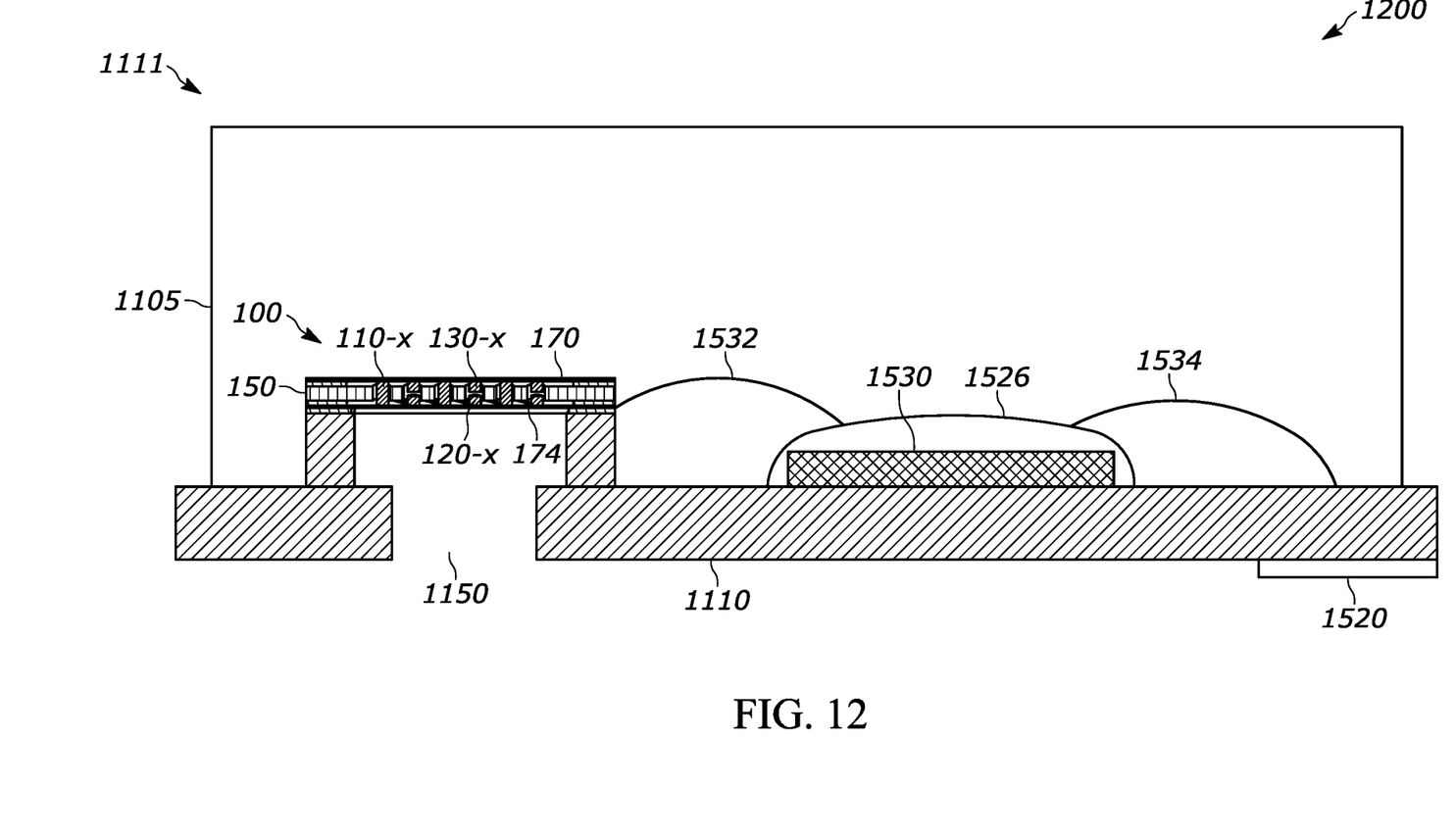
FIG. 12 is an example cross-section view of a sensor package according to a possible embodiment.
Figure 13:
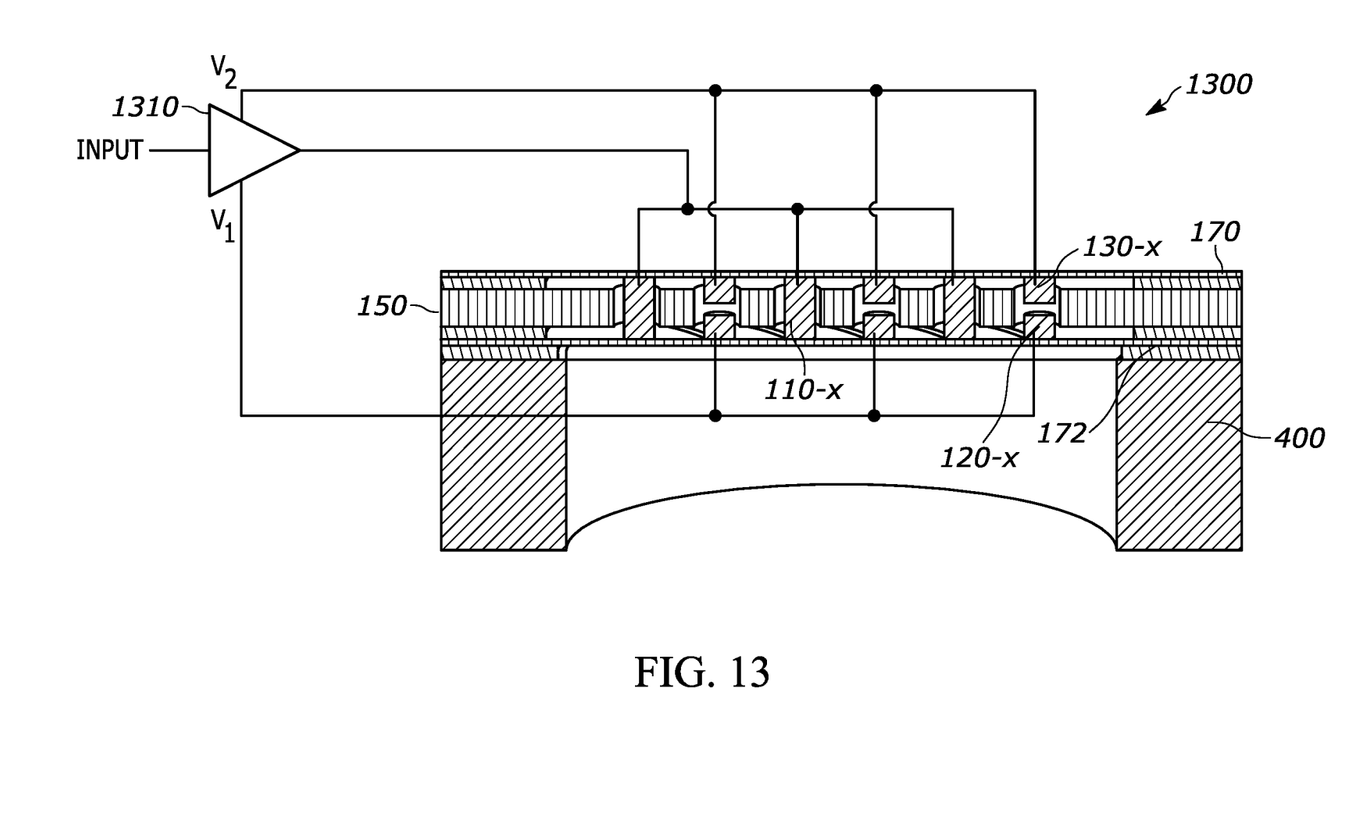
FIG. 13 is an example illustration of an application of a MEMS device according to a possible embodiment.

FIG. 1 is an example cross-section view of a MEMS device 100 according to a possible embodiment. FIG. 2 is an example isometric view of a MEMS device 200 according to a possible embodiment. FIG. 3 is an example cross-section view of a MEMS device 300 according to a possible embodiment. FIGS. 4-7 are example isometric views of MEMS devices 400, 500, 600, and 700 according to possible embodiments. FIGS. 8-11 are example cross-section views of MEMS devices 800, 900, 1000, and 1100 according to possible embodiments. FIG. 12 is an example cross-section view of a sensor package 1200 according to a possible embodiment. FIG. 13 is an example illustration 1300 of an application of the MEMS device 400, or any other disclosed MEMS device, according to a possible embodiment.

Generally, with reference to FIGS. 1-3, a MEMS device can include a first electrode 110 oriented lengthwise along and parallel to an axis 160. The first electrode 110 can have a first end 111 and a second end 112. The MEMS device can include a second electrode 120 oriented lengthwise along and parallel to the axis 160. The second electrode 120 can have a first end 121 and a second end 122. The MEMS device can include a third electrode 130 oriented lengthwise along and parallel to the axis 160. The third electrode 130 can have a first end 131 and a second end 132. The electrodes 110, 120, and 130 can be cylinders, plates, cuboids, prisms, polyhedrons, or other shapes of electrodes. The length of the first electrode 110 can be longer than the length of the second electrode 120 and longer than the length of the third electrode 130. The MEMS device includes a dielectric 150 interspersed between the electrodes. The dielectric 150 has a plurality of apertures 156 (not shown in FIG. 1) that penetrate through the dielectric 150 in a direction parallel to an axis 160. The first, second, and third electrodes can each be located at least partially within an aperture of the plurality of apertures 156. Being located at least partially within an aperture can imply part of an electrode is located within an aperture and/or the electrode is located in part of the aperture. According to a possible embodiment, at least the second and third electrodes can be located only partially within the apertures 156 for the ends to be located outside the solid dielectric 150. The electrodes can be substantially fixed relative to each other. For example, the electrodes can be substantially fixed while allowing for some relative movement due to flexation and other forces. The dielectric 150 and electrodes are free to move relative to each other.

A voltage from a first voltage source $V_1$ is applied between the first electrode 110 and the second electrode 120 producing a relatively constant force $F_1$. A voltage from a second voltage source $V_2$ is applied between the first electrode 110 and the third electrode 130 to produce a relatively constant force $F_2$. Forces $F_1$ and $F_2$ are in opposition. If the structure is relatively symmetric and the magnitude of the voltage sources $V_1$ and $V_2$ are equal, forces $F_1$ and $F_2$ are equal and thus a net zero force is exerted between the dielectric and the electrodes. The magnitude of the voltages from the voltage sources $V_1$ and $V_2$ can be unequal to compensate for asymmetries in the structure or to intentionally create a non-zero net force between the dielectric and the electrodes.

The MEMS device can be a MEMS transducer. For example, the MEMS device can be a sensor or actuator. The MEMS device can be driven mechanically, such as for use as a differential sensor, microphone, vibration sensor, or other sensor. The MEMS device can also be driven electrically, such as to create mechanical motion as an actuator or a speaker.

The MEMS device includes at least one dielectric 150. Referring to FIG. 2, according to a possible embodiment, the dielectric 150 can be a solid dielectric that can include a plurality of apertures 156. The apertures 156 are illustrated as cylindrical for convenience purposes, but can take any useful shape. The dielectric 150 can surround the second end 122 of the second electrode 120 and the first end 131 of the third electrode 130. The first end 121 of the second electrode 120 and the second end 132 of the third electrode 130 can be located outside of the solid dielectric 150. According to a possible embodiment, the dielectric 150 can fill at least 50% of a distance between the first and second electrode 120. The distance can be perpendicular to the first length of the first electrode 110. For example, the dielectric 150 can fill at least 75% of the distance, at least 80% of the distance, at least between 80-90% of the distance. However, the dielectric 150 can fill any amount from 1% to 99% of the distance. The more the dielectric fills the gap between the electrodes, the more the capacitance changes per unit of displacement and thus the higher the force generated for a given voltage bias between electrodes. Some minimal gap should remain between the dielectric and the electrodes, subject to fabrication constraints, so that the dielectric and electrodes remain moveable relative to each other. While some embodiments show the solid dielectric 150 having apertures 156, such as channels or passages, the solid dielectric 150 can also take other forms such as one or more segments or members, as shown in other embodiments.

The dielectric 150 can be movable relative to the first, second, and third electrodes. For example, the dielectric 150 can be substantially and deliberately movable beyond slight movement due to incidental flexing, bending, bumping, and other slight movement of the dielectric 150. Furthermore, when the dielectric 150 can be movable parallel to the axis 160 relative to the first, second, and third electrodes, the first, second, and third electrodes can also be movable relative to the dielectric 150. Thus, by the electrodes and dielectric 150 being movable relative to each other, the electrodes and/or the dielectric 150 may or may not be fixed or movable relative to other elements of the MEMS device, relative to earth, and/or relative to any other point of reference.

A first capacitance exists between the first electrode 110 and the second electrode 120. A second capacitance exists between the first electrode 110 and the third electrode 130. The capacitance between electrodes can be a function of the dielectric 150. For example, values of the first and second capacitance can change in opposite directions when there is motion of the dielectric 150 in a direction parallel to the axis 160 relative to the electrodes. For example, when the dielectric 150 moves and causes the first capacitance to increase, the second capacitance can decrease. An electrostatic force on the dielectric 150 relative to the electrodes 110, 120, and 130 can be substantially unchanged relative to the displacement.

The first electrode 110 can be disposed at least partially within a first aperture of the plurality of apertures 156. The second end 122 of the second electrode 120 can be disposed within a second aperture of the plurality of apertures 156. The first end 131 of the third electrode 130 can be disposed within a third aperture of the plurality of apertures 156. The first, second, and third apertures can be different apertures.

The dielectric 150 can include a first surface 151 and a second surface 152. The first surface 151 and the second surface 152 can be parallel to a plane perpendicular to the axis 160. The first end 111 and the second end 112 of the first electrode 110 can be located outside of the dielectric 150. The first electrode 110 second end 112 and the third electrode 130 second end 132 can extend beyond the dielectric 150 second surface 152. The second electrode 120 first end 121 can extend beyond the dielectric 150 first surface 151. The first electrode 110 first end 111 can also extend beyond the dielectric 150 first surface 151.

In an embodiment, the first electrode 110 can be an electrically conductive pin of a plurality of first electrically conductive pins electrically connected to each other. The second electrode 120 can be an electrically conductive pin of a plurality of second electrically conductive pins electrically connected to each other. The third electrode 130 can be an electrically conductive pin of a plurality of third electrically conductive pins electrically connected to each other.

Referring to FIG. 3, according to a possible embodiment, the first electrode can be a plurality of first electrodes 110-$x$, the second electrode can be a plurality of second electrodes 120-$x$, and the third electrode can be a plurality of third electrodes 130-$x$. The plurality of second and third electrodes 120-$x$ and 130-$x$ can be staggered on either side of the plurality of first electrodes 110-$x$. This can allow for more capacitance and an increase in the change of capacitance with displacement. Other configurations of conductive and dielectric elements, such as bars or rings, can also be used. The plurality of first electrodes 110-$x$ may be referred to collectively as a first plurality of electrodes. Similarly, the plurality of second electrodes 120-$x$ may be referred to collectively as a second plurality of electrodes, and the plurality of third electrodes 130-$x$ may be referred to collectively as a third plurality of electrodes.

Referring to FIGS. 4-7 to accommodate the pluralities of conductive pins connected to each other, the first, second, and third apertures 156 can be respective first, second, and third pluralities of apertures 156. The first plurality of electrically conductive pins can be arranged in a two-dimensional array in a plane perpendicular to the axis 160. The second and third plurality of electrically conductive pins can be arranged in respective two-dimensional arrays in a plane perpendicular to the axis 160 and interspersed among the first plurality of electrically conductive pins. According to a possible embodiment, the dielectric 150 can be considered a non-conductive electrical field modulating member, depending on the implementation.

Figure 4:
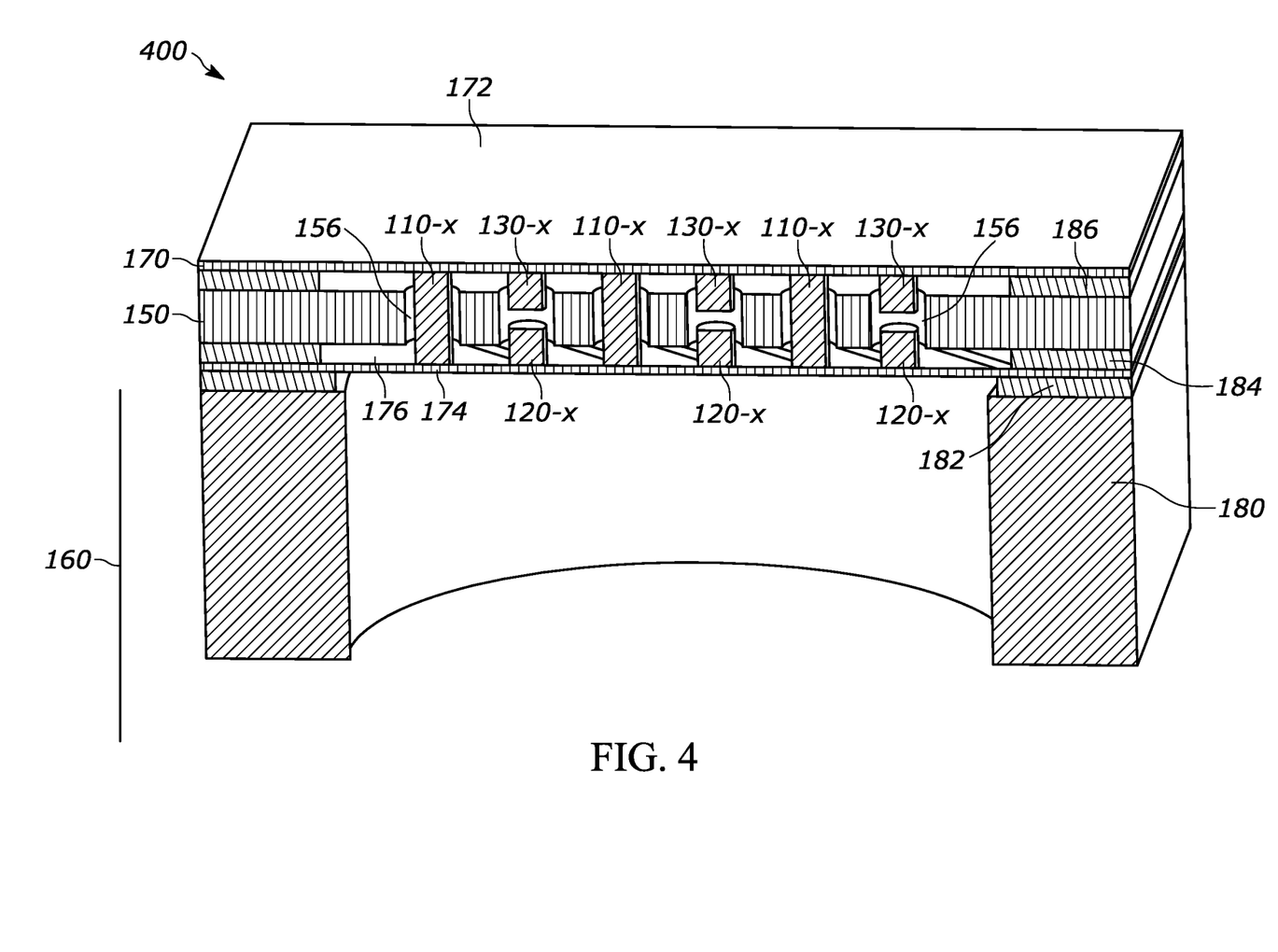
FIGS. 4-7 are example isometric views of MEMS devices according to possible embodiments.

Referring to FIG. 4, the MEMS device can include a diaphragm 170 coupled to at least the first electrodes 110-$x$. The diaphragm 170 can have a substantially planar surface 172 perpendicular to the axis 160. The surface 172 can be substantially planar in that there may be imperfections on the surface 172 or the surface 172 may be slightly curved or uneven while still allowing the surface 172 to operate in a manner useful for a diaphragm. The diaphragm 170 can also have sandwiched layers.

According to a possible embodiment, the diaphragm 170 can be a first diaphragm coupled to the first electrodes 110-$x$ and the third electrodes 130-$x$. The MEMS device can include a second diaphragm 174 coupled to the first electrodes 110-$x$ and the second electrodes 120-$x$. The second diaphragm 174 can be located on an opposite side of the dielectric 150 from the first diaphragm 170. The second diaphragm 174 can have a substantially planar surface 176 perpendicular to the axis 160. The first diaphragm 170 and the second diaphragm 174 are spaced from the dielectric 150 to permit relative movement between the electrodes connected to the first and second diaphragms and the dielectric 150. A low-pressure region can be established and sealed between the diaphragms 170 and 174 in order to reduce noise and damping of the structure. The first electrodes 110-$x$ are connected to both the first diaphragm 170 and the second diaphragm 174 and prevent the diaphragms from collapsing onto the dielectric 150. This low-pressure region can be substantially a vacuum such as a pressure less than 1 Torr, less than 300 mTorr, or less than 100 mTorr.

The diaphragms 170 and 174 can be made of a dielectric material, such as silicon nitride. The dielectric 150 can be silicon nitride. The electrodes 110-$x$, 120-$x$, and 130-$x$ can be poly silicon. However, other materials can be used. For example, one or more of the diaphragm 170, the diaphragm 174, and the dielectric 150 can be polyimide. As another example, conductors for the electrodes can be plated metals.

Referring to FIG. 4, the dielectric 150 is fixed in position with its periphery attached to a substrate 180 by means of spacer layers 182, 184, and 186. The peripheries of the diaphragms are also attached to the substrate 180 by means of spacer layers 182, 184, and 186. The dielectric 150 is relatively thick and stiff compared to the diaphragms 172 and 174 and remains relatively motionless when the diaphragms 172 and 174 are deflected. Deflection of the diaphragms 172 and 174 moves the electrodes 110-$x$, 120-$x$, and 130-$x$ relative to the dielectric 150.

Figure 5:
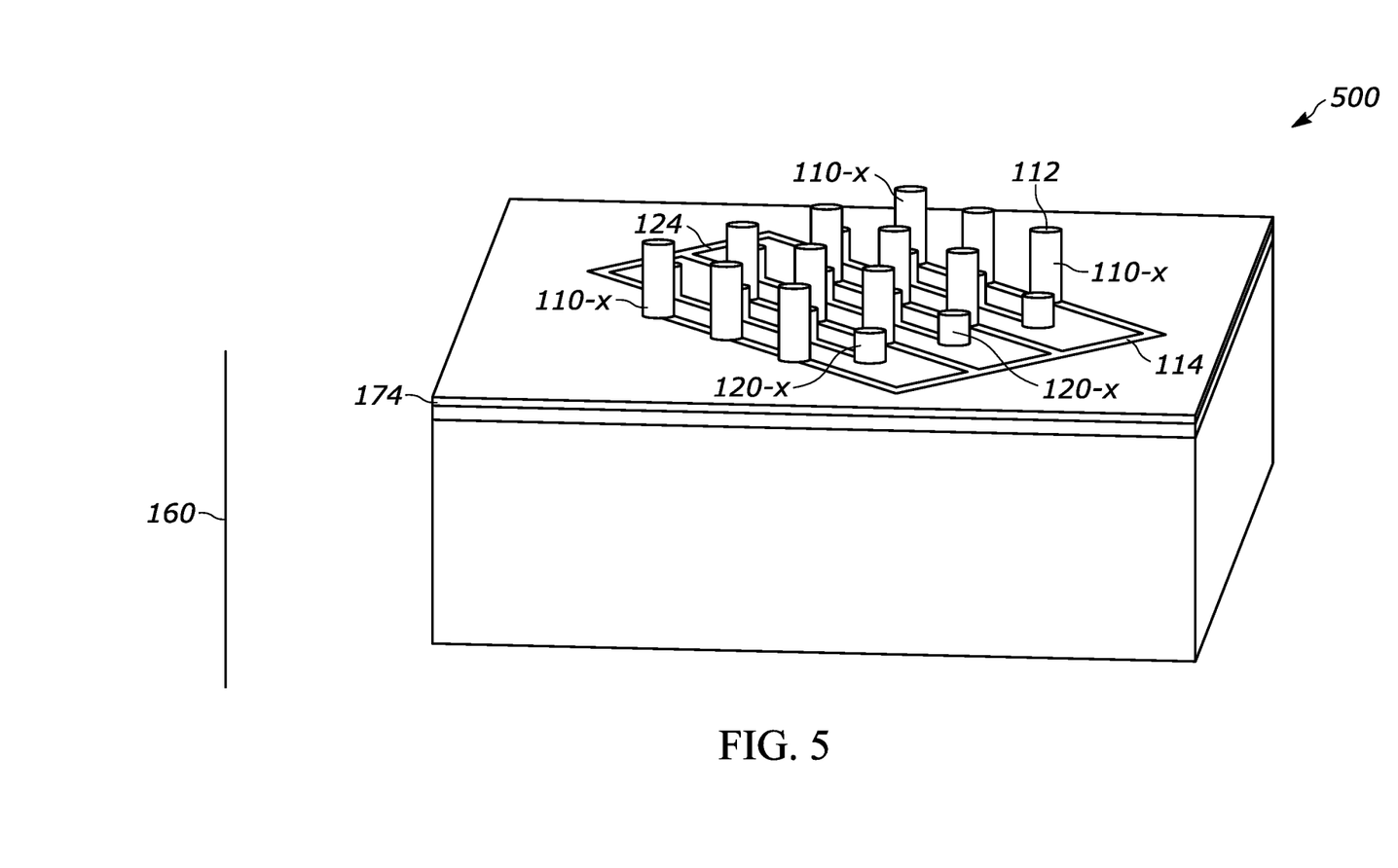

FIG. 5 shows a perspective view of the MEMS device of FIG. 4, which is partially constructed, showing only second diaphragm 174, first electrodes 110-$x$, and second electrodes 120-$x$. An example interconnect 114 is shown electrically connecting the electrodes 110-$x$ (e.g., the pins of a first electrode) while an example interconnect 124 is shown electrically connecting the electrodes 120-$x$ (e.g., the pins of a second electrode).

Figure 6:
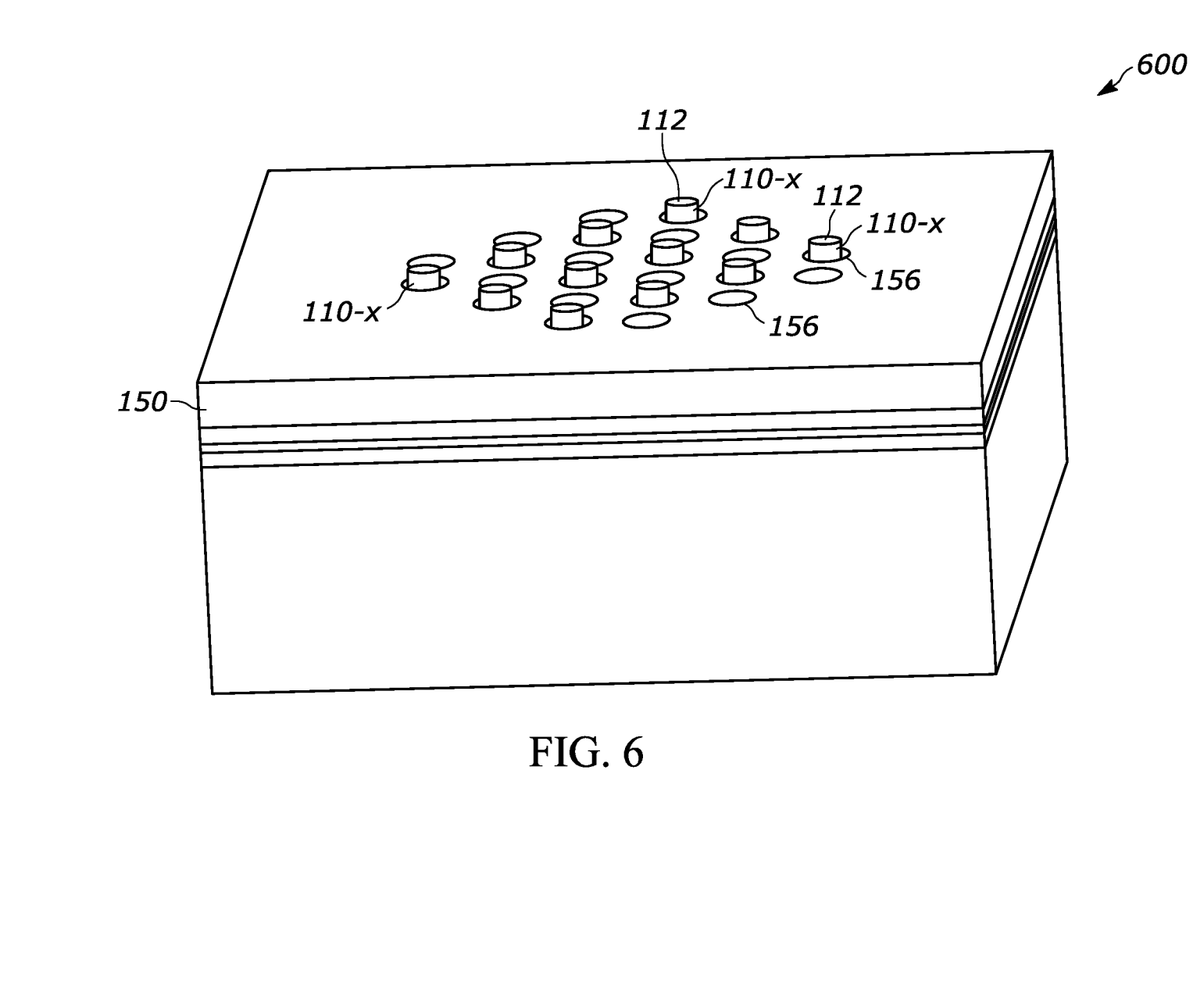

FIG. 6 continues the construction of the MEMS device of FIG. 4 with the addition of dielectric 150 containing apertures 156 with the first and second electrodes placed within the apertures 156.

Figure 7:
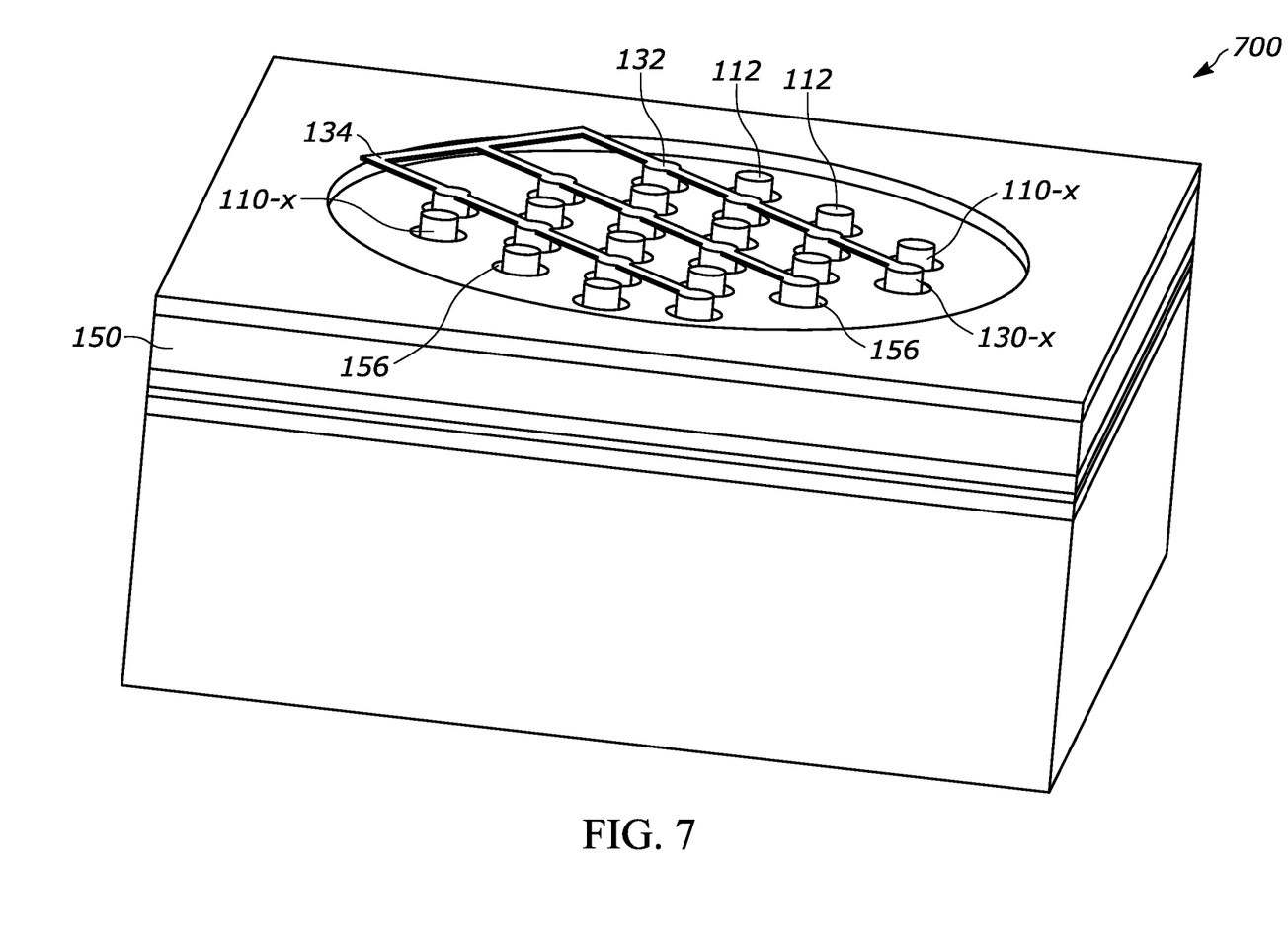

FIG. 7 continues the construction of the MEMS device of FIG. 4 with placement of the third electrodes 130-$x$ and an example interconnect 134 electrically connecting the third electrodes 130-$x$ (e.g., the pins of the third electrode 130-$x$). The construction continues with the addition of the first diaphragm 170 and the removal of the central region of spacer layers 182, 184, and 186 by a sacrificial etch to form the MEMS device of FIG. 4.

Figure 8:
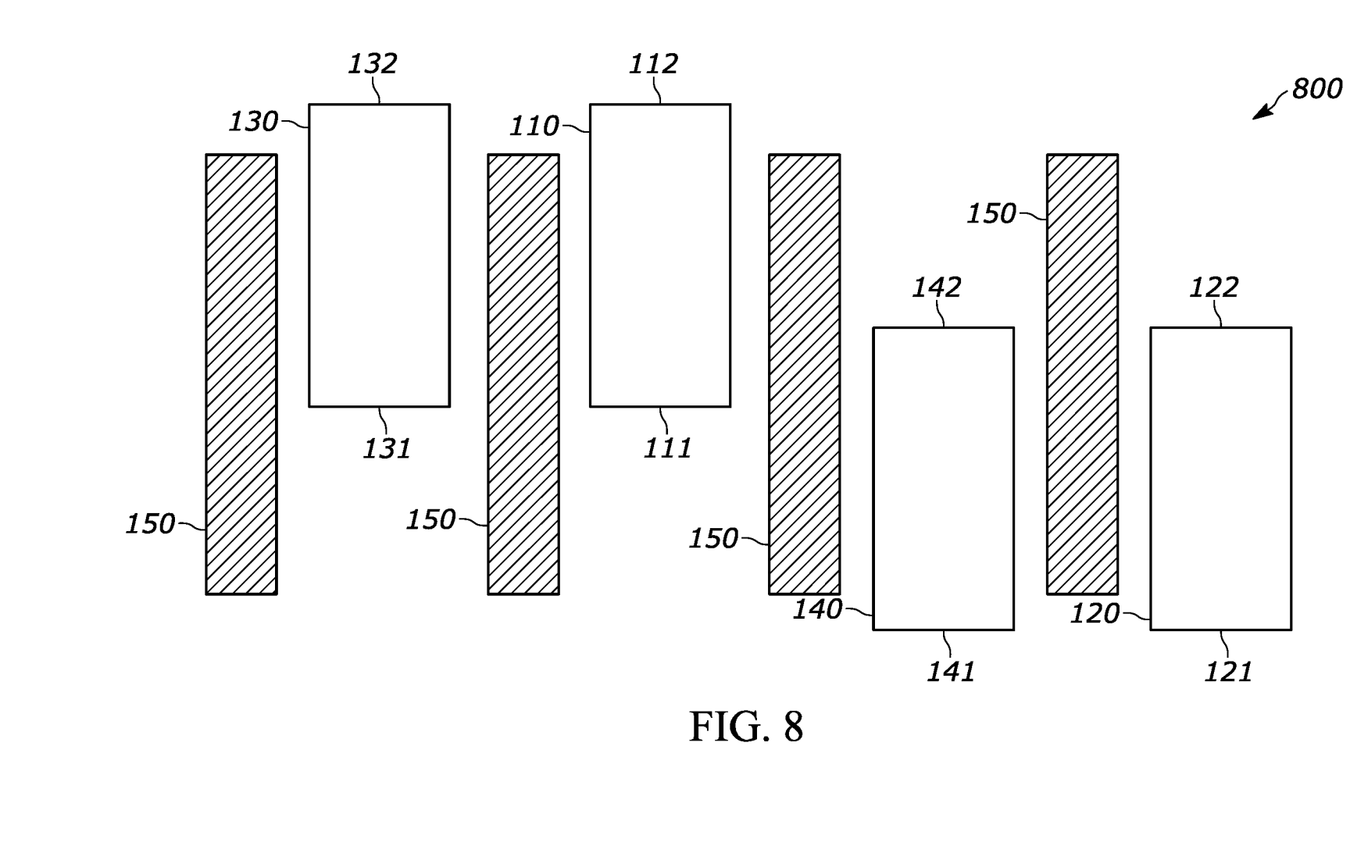
FIGS. 8-11 are example cross-section views of MEMS devices according to possible embodiments.
Figure 9:
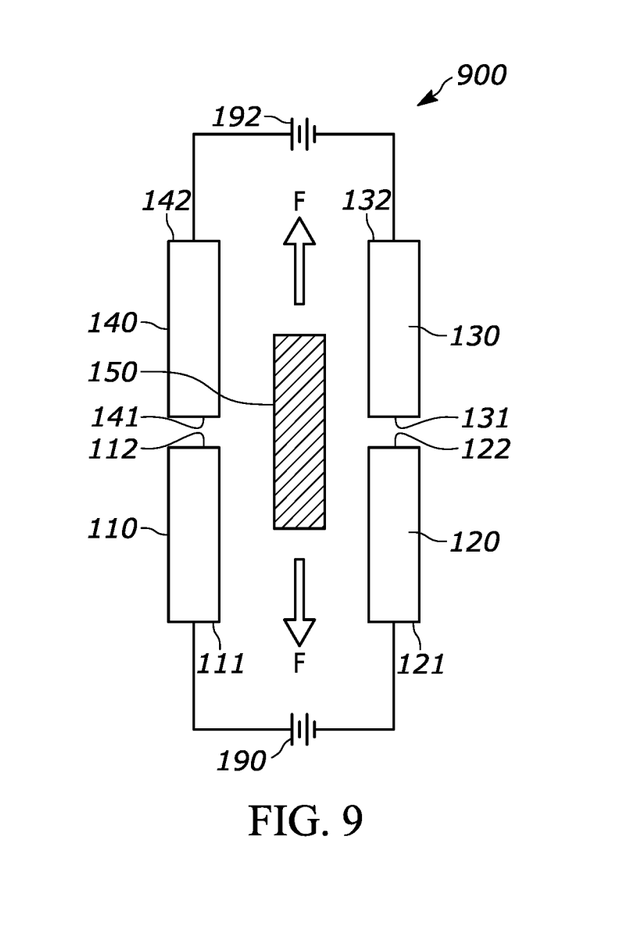

Referring to FIGS. 8 and 9, the MEMS device can include a fourth electrode 140. The fourth electrode 140 can have a first end 141 and a second end 142. The dielectric 150 can surround the first end 111 of the first electrode 110 and the second end 142 of the fourth electrode 140. The second end 112 of the first electrode 110 and the first end 141 of the fourth electrode can be located outside the dielectric 150. The fourth electrode 140 may or may not be electrically coupled to the first electrode 110. Referring to FIG. 9, the fourth electrode 140 can be coaxial with the first electrode 110, such as by being located in the same aperture.

Referring to FIG. 4, the second electrodes 120-$x$ can be coaxial with respective third electrodes 130-$x$. Referring to FIGS. 9-11, the second electrodes 120-$x$ can be coaxial with the respective third electrodes 130-$x$. For example, the second and third electrodes can be located in the same aperture. Referring to FIGS. 10 and 11, an optional dielectric support layer D can be present between the second and third electrodes 120 and 130. The dielectric support layer D may or may not have same cross-sectional area as the second and third electrodes 120 and 130. The dielectric D can be used for structural purposes while considering any additional parasitic capacitance. For example, the dielectric D can be used to prevent collapse or contact between the second electrode 120 and the third electrode 130 if the cavity between the diaphragms is under a vacuum.

Referring to FIG. 10, the MEMS device, acting as a sensor such as used in a microphone, can include a first charge amplifier 194 coupled to the second electrode 120. The first charge amplifier 194 can bias the second electrode 120 to a first potential relative to the first electrode 110. The MEMS device can include a second charge amplifier 196 coupled to the third electrode 130. The second charge amplifier 196 can bias the third electrode 130 to a second potential relative to the first electrode 110. The first potential can be substantially equal to the second potential. The first potential can also be different from the second potential. The first and second charge amplifiers 194 and 196 can produce complementary outputs when the dielectric 150 is moved relative to the electrodes. For example, Q=C*V and when using a charge amplifier, V is held constant. When C goes up, Q can go up and vice versa. This can lead to complementary outputs.

For example, according to a possible embodiment, one electrode, such as the electrode 110 can be full length and another electrode can be segmented, such as into electrodes 120 and 130. The first electrode 110 can be biased. Using charge amplifiers 194 and 196, driven electrodes 120 and 130 can be biased to a fixed potential, i.e. ground, by a very high value resistance across the feedback capacitor. The charge amplifiers 194 and 196 can produce complementary outputs when the dielectric 150 is moved along an axis substantially parallel to the lengths of the first, second, and third electrodes.

Referring to FIG. 11, the MEMS device, acting as a sensor, such as used in a microphone, can include a high input impedance voltage amplifier 1000 including a first input 1010 and a second input 1020. The first input 1010 can be coupled to the second electrode 120 and the second input 1020 can be coupled to the third electrode 130. The inputs 1010 and 1020 are biased to a fixed potential, i.e. ground, by very high value resistances. As discussed above, Q=C*V. When using a high impedance amplifier, Q can be held constant since there is no current. When C goes up, V goes down, and vice versa. This can lead to a complementary output.

Referring to FIG. 12, the MEMS device 100 or any other disclosed MEMS device can be part of a sensor package 1200. The sensor package 1200 can include an enclosure 1111 that can include a base 1110 and a cover 1105, such as a can or any other cover, coupled to the base 1110. The first, second, and third electrodes 110-$x$, 120-$x$, and 130-$x$, and the solid dielectric 150 can be located within the enclosure 1111. For example, the enclosure 1111 can enclose a MEMS device between the cover 1105 and the base 1110. The sensor package 1100 can include an external-device interface 1520 disposed on the base 1110. The external-device interface 1520 can be implemented as a surface-mount interface or can include leads configured for through-hole mounting on a host device.

The sensor package 1200 can include an integrated circuit 1530, such as an Application Specific Integrated Circuit (ASIC) electrically coupled to the first, second, and third electrodes 110, 120, and 130. The integrated circuit 1530 can also be coupled to contacts of the external-device interface 1520, such as via an electrical lead 1534 and/or leads running through the base 1110. The integrated circuit 1530 can receive an electrical signal from the MEMS device 100, such as via an electrical lead 1532, and can communicate, such as via the electrical lead 1534 and/or leads in the base 1110, with a host device by using the contacts of the external device interface 1520. According to a possible implementation, the integrated circuit 1530 can be covered by a protective coating 1526.

According to a possible embodiment, the base 1110 can include a sound port 1150. The MEMS device 100 can be acoustically coupled to the sound port 1150. For example, the sound port 1150 can be an aperture in the base 1110 that allows sound to pass through the base to the MEMS device 100. Illustrated embodiments can be considered a bottom port embodiment, but the sound port 1150 can be located at other locations on the transducer assembly. For example, the sound port 1150 can also be on the cover 1105 for a top-port transducer assembly. The sound port 1150 can further be on a side of the sensor package 1100, the sound port 1150 can be anywhere else on the sensor package 1100, or there can be no sound port 1150, such as for a MEMS die vibration sensor or other sensor. According to a possible embodiment, when the MEMS device 100 includes at least one diaphragm 170 and/or 174 the diaphragm 170 and/or 174 can be acoustically coupled to the sound port 1150. According to other embodiments, the MEMS device 100 may not be used in a sensor package, such as when the MEMS device 100 is an actuator, as discussed above.

Referring to FIG. 13, the MEMS device, such as the MEMS device 400 or any other disclosed MEMS device, acting as an actuator such as used in a speaker, is connected to an amplifier 1310. The output of the amplifier 1310 is connected to the first electrodes 110-$x$ of the MEMS device. The second and third electrodes 120-$x$ and 130-$x$ are connected to the power supply rails, $V_1$ and $V_2$, respectively. The output of the amplifier 1310 varies between the power supply rail values of $V_1$ and $V_2$ in response to an input signal. When the amplifier output is mid rail, $(V_1+V_2)/2$, the electrostatic force applied to the electrodes, and hence to the diaphragms 170 and 172, is balanced. As the amplifier output approaches one of the power supply rails, the electrostatic force applied to the electrodes and hence the diaphragms reaches a maximum in one direction. As the amplifier output approaches the opposite power supply rail, the electrostatic force applied to the electrodes and hence the diaphragms reaches a maximum in the other direction. Each of the electrostatic forces is proportional to the square of the applied voltage. However, the net force is linear with the applied voltage and hence is linear with the input to the amplifier.

The amplifier 1310 can be a Pulse Width Modulation (PWM) or a Pulse Density Modulations (PDM) amplifier where its output is digital, swinging between the two power supply rails. The average value of a PWM amplifier's output and the average value of a PDM amplifier's output are a function of their input. The output of the digital amplifier is applied to the first electrodes 110-$x$. The second and third electrodes 120-$x$ and 130-$x$ are connected to the power supply rails, $V_1$ and $V_2$, respectively. The net force thus produced is linear with the input to the digital amplifier. The diaphragms can couple their movement directly to air hence producing sound or they can couple their movement through an auxiliary diaphragm to move air and thus produce sound.

According to a possible embodiment, a MEMS device can include a solid dielectric, the dielectric can have a first outer surface and a second outer surface opposite the first outer surface. The dielectric can have a plurality of passages, such as apertures, each of the plurality of passages can have an opening on the first outer surface and an opening on the second outer surface. The MEMS device can be a MEMS transducer. The MEMS device can include an electrode set. The dielectric and electrode set can be movable relative to each other.

The electrode set can include a first electrode partially disposed within a first passage of the plurality of passages such that a first end of the first electrode extends beyond the first outer surface and a second end of the first electrode extends beyond the second outer surface. The first electrode can be an electrode of a plurality of first electrodes electrically connected to each other.

The electrode set can include a second electrode disposed partially within a second passage of the plurality of passages such that a first end of the second electrode extends beyond the first outer surface and a second end of the second electrode is within the second passage. The second electrode can be an electrode of a plurality of second electrodes electrically connected to each other.

The electrode set can include a third electrode disposed partially within a third passage of the plurality of passages such that a first end of the third electrode is within the third passage and a second end of the third electrode extends beyond the second outer surface. The third electrode can be an electrode of a plurality of third electrodes electrically connected to each other. The first, second, and third electrodes can be fixed relative to one another.

According to another possible embodiment, an apparatus can include an electrode set and a dielectric member. The electrode set can include at least a first, a second, and a third electrode. The electrodes of the electrode set can each have an individual height with a top and bottom surface at the ends of each height. A capacitance exists between at least the first and second electrodes and the first and third electrodes of the electrode set.

The dielectric member can have a height with a top and bottom surface at the ends of the height. The dielectric member can have holes through the member such that the dielectric member surrounds the electrode set and is spaced from each electrode in the electrode set. The dielectric member may not be in mechanical contact with any electrode in the electrode set.

The top surface of the first electrode of the electrode set can be above the top surface of the dielectric member and the bottom surface of the first electrode of the electrode set can be below the bottom surface of the dielectric member. The top surface of the second electrode of the electrode set can be above the top surface of the dielectric member and the bottom surface of the second electrode can be between the top surface and the bottom surface of the dielectric member. The top surface of the third electrode of the electrode set can be between the top surface and the bottom surface of the dielectric member and the bottom surface of the third electrode of the electrode set can be below the bottom surface of the dielectric member.

The physical positions of the electrodes of the electrode set can be substantially fixed relative to one another. The physical position of the electrode set relative to the position of the dielectric member can be allowed movement.

The relative position of each electrode to the others can be substantially fixed. Some electrodes can be fixed while allowing others to move. For instance, the first electrode and the dielectric member can be fixed together and the second and third electrodes can be allowed to move relative to the dielectric member. Other configurations are possible.

The first electrode of the electrode set can be split into two electrically independent members. The first member can have the top surface and a second bottom surface. The second member can have a second top surface and the bottom surface. The top surface of the first member of the first electrode can be above the top surface of the dielectric member. The second bottom surface of the first member of the first electrode can be between the top and bottom surfaces of the dielectric member. The second top surface of the second member of the first electrode can be between the top and bottom surfaces of the dielectric member and the bottom surface of the second member of the first electrode can be below the bottom surface of the dielectric member.

According to a possible embodiment, a MEMS device can include a solid dielectric including a plurality of apertures. The MEMS device can include a first plurality of electrodes, the first plurality of electrodes extending completely through a first subset of the plurality of apertures. The MEMS device can include a second plurality of electrodes, the second plurality of electrodes extending partially into a second subset of the plurality of apertures. The second subset can be different from the first subset. The MEMS device can include a third plurality of electrodes, the third plurality of electrodes extending partially into a third subset of the plurality of apertures. The third subset can be different from the first subset.

According to a possible implementation of the above embodiment, the solid dielectric can include a first side and a second side opposite from the first side. The plurality of apertures can extend from the first side to the second side. The second plurality of electrodes can extend partially into the second subset from the first side. The third plurality of electrodes can extend partially into the third subset from the second side. The second subset can be the same as or different from the third subset.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

In this document, relational terms such as "first," "second," and the like may be used solely to distinguish one entity or action from another entity or action without necessarily requiring or implying any actual such relationship or order between such entities or actions. The phrase "at least one of" "at least one selected from the group of" or "at least one selected from" followed by a list is defined to mean one, some, or all, but not necessarily all of, the elements in the list. The terms "comprises," "comprising," "including," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is not admitted as prior art, is written as the inventor's own understanding of the context of some embodiments at the time of filing, and includes the inventor's own recognition of any problems with existing technologies and/or problems experienced in the inventor's own work.

We claim:

1. A microelectromechanical systems (MEMS) device comprising:
    a solid dielectric including a plurality of apertures, the solid dielectric having a first side and a second side;
    a first plurality of electrodes extending completely through a first subset of the plurality of apertures;
    a second plurality of electrodes extending partially through a second subset of the plurality of apertures;

a third plurality of electrodes extending partially into a third subset of the plurality of apertures;

a first diaphragm coupled to the first plurality and to the third plurality of electrodes, the first diaphragm facing the first side of the solid dielectric; and a second diaphragm coupled to the first plurality and to the second plurality of electrodes the second diaphragm facing the second side of the solid dielectric.

2. The MEMS device according to claim 1, wherein a low-pressure region is established between the first and second diaphragms.

3. The MEMS device according to claim 1, further comprising:

a first interconnect electrically connecting the electrodes of the first plurality;

a second interconnect electrically connecting the electrodes of the second plurality; and a third interconnect electrically connecting the electrodes of the third plurality.

4. The MEMS device according to claim 1, wherein the electrodes of the first, second, and third plurality of electrodes are pins.

5. The MEMS device according to claim 1, wherein a first capacitance exists between the first plurality of electrodes and the second plurality of electrodes, and wherein a second capacitance exists between the first plurality of electrodes and the third plurality of electrodes.

6. The MEMS device according to claim 1, further comprising a fourth plurality of electrodes, the fourth plurality of electrodes having first ends and second ends, wherein the dielectric surrounds first ends of the first plurality of electrodes and the second ends of the fourth plurality of electrodes, and wherein second ends of the first plurality of electrodes and the first ends of the fourth plurality of electrode are located outside the dielectric.

7. The MEMS device according to claim 1, wherein the dielectric comprises a first surface on the first side and a second surface on the second side, wherein second ends of the first plurality of electrodes and second ends of the third plurality of electrodes extend beyond the second surface, and and wherein first ends of the second plurality of electrode extend beyond the first surface.

8. The MEMS device according to claim 1, wherein the dielectric is movable relative to the first, second, and third pluralities of electrodes.

9. The MEMS device according to claim 1, wherein the position of the first plurality of electrodes is fixed relative to the position of the second plurality of electrodes and the third plurality of electrodes, and the position of the second plurality of electrodes is fixed relative to the position of the third plurality of electrodes.

10. A sensor package comprising:

a microelectromechanical systems (MEMS) transducer comprising:

a solid dielectric including a plurality of apertures, the solid dielectric having a first side and a second side, a first plurality of electrodes extending completely through a first subset of the plurality of apertures, a second plurality of electrodes extending partially through a second subset of the plurality of apertures, a third plurality of electrodes extending partially into a third subset of the plurality of apertures, a first diaphragm coupled to the first plurality and to the third plurality of electrodes, the first diaphragm facing the first side of the solid dielectric, a second diaphragm coupled to the first plurality and to the second plurality of electrodes the second diaphragm facing the second side of the solid dielectric; and an enclosure that includes a cover and a base, wherein the cover is attached to the base, the enclosure having a sound port, and wherein the MEMS transducer is disposed within the enclosure and acoustically coupled to the sound port.

11. The sensor package of claim 10, wherein the sound port is an aperture in the base.

12. The sensor package of claim 10, wherein the sound port is on the cover.

* * * * *